United States Patent [19]

Phillips et al.

[11] 4,149,161
[45] Apr. 10, 1979

[54] PROTECTING ELECTRICAL APPARATUS WITH GAS GENERATING COMPOUNDS

[75] Inventors: David C. Phillips, Penn Hills; James D. B. Smith, Wilkins Township, Allegheny County, both of Pa.

[73] Assignee: Westinghouse Electric Corp., Pittsburgh, Pa.

[21] Appl. No.: 751,403

[22] Filed: Dec. 16, 1976

[51] Int. Cl.$^2$ .............................................. G08B 21/00
[52] U.S. Cl. ................................. 340/632; 73/339 R; 250/303; 260/33.6 EP
[58] Field of Search ........................... 340/237 R, 632; 250/303; 260/33.6 EP; 73/339 R

[56] References Cited

U.S. PATENT DOCUMENTS

| | | | |
|---|---|---|---|
| 3,090,859 | 5/1963 | Rodin | 250/303 |
| 3,427,880 | 2/1969 | Grobel et al. | 340/237 R X |
| 3,720,935 | 3/1973 | Tomlin, Jr. | 340/237 R X |

*Primary Examiner*—John W. Caldwell, Sr.
*Assistant Examiner*—Daniel Myer
*Attorney, Agent, or Firm*—R. D. Fuerle

[57] ABSTRACT

Electrical apparatus cooled with a stream of hydrogen gas is protected from overheating by applying a coating to a portion of the apparatus which is exposed to the gas stream. The coating contains a compound which decomposes between 80° and 200° C. to produce a gas detectable by a monitor. The monitor detects gases heavier than hydrogen in the gas stream and sounds an alarm when they are present.

8 Claims, 2 Drawing Figures

PROTECTING ELECTRICAL APPARATUS WITH GAS GENERATING COMPOUNDS

PRIOR ART

S. C. Browne, in a book published by the Massachusetts Institute of Technology Press, 1966, titled "Basic Data of Plasma Physics," disclosed that the recombination rate of hydrogen ions will be slower if another gas is present.

CROSS-REFERENCE TO RELATED APPLICATIONS

A number of the compounds used in this invention are described in the following applications:

Ser. No. 645,164, filed Dec. 30, 1975, by J. D. B. Smith et al., titled "Sulfonic Acid Composition for Forming Thermoparticulating Coating," now U.S. Pat. No. 4,046,733.

Ser. No. 568,224, filed Apr. 15, 1975, by J. D. B. Smith et al., titled "Diazonium Salt Composition for Forming Thermoparticulating Coating," now U.S. Pat. No. 3,979,353.

Ser. No. 726,040, filed Sept. 23, 1976, by J. D. B. Smith et al., titled "N-thiophthalimide Composition for Forming Thermoparticulating Coating."

Ser. No. 568,221, filed Apr. 15, 1975, by J. D. B. Smith et al., titled "Metal Acetyl Acetonate Composition for Forming Thermoparticulating Coating," now U.S. Pat. No. 3,973,439.

Ser. No. 634,217, filed Nov. 21, 1975, by J. D. B. Smith et al., titled "Metal Dithiocarbamate Composition for Forming Thermoparticulating Coating," now U.S. Pat. No. 4,056,006, Ser. No. 699,561, filed June 24, 1976, by J. D. B. Smith et al., titled "Organo-Sulfur Composition for Forming Thermoparticulating Coating."

Ser. No. 726,039, filed Sept. 23, 1976, by J. D. B. Smith et al., titled "Urea Composition for Forming Thermoparticulating Coating."

Ser. No. 702,257, filed July 2, 1976, by J. F. Meier et al., titled "Cyanoethylated Composition for Forming Thermoparticulating Coating."

Ser. No. 568,222, filed Apr. 15, 1975, by J. D. B. Smith et al., titled "Blocked Isocyanate Composition for Forming Thermoparticulating Coating," now U.S. Pat. No. 4,056,005.

BACKGROUND OF THE INVENTION

Electrical apparatus, such as motors and turbine generators, occasionally overheat due to shorts or other malfunctions. The longer the overheating continues the more damage is done to the apparatus. A malfunction detected immediately may mean only a quick repair but if the overheating continues, the entire machine may be damaged.

Large rotating electrical apparatus is usually cooled with a hydrogen gas stream. The organic compounds in the apparatus are first to be affected by the overheating and they decompose to form particles which enter the gas stream. Monitors then detect particles in the gas stream and sound a warning or shut down the apparatus when too many particles are detected.

As the hereinbefore cited cross-referenced patent applications disclose, special coatings may be applied to the apparatus which decompose and form detectable particles at a lower temperature than the usual organic compounds found in the apparatus. If an ion chamber monitor is used to detect particles in the gas stream, these coatings would thermally degrade to produce particles (i.e., thermoparticulate) which results in a decrease in the current in the monitor.

SUMMARY OF THE INVENTION

We have discovered that certain compounds, instead of decreasing the current in an ion chamber when they thermoparticulate, will actually increase it. We have further found that this effect is due to the emission of a gas during or prior to thermoparticulation, rather than to a particle as is the case when the current is decreased.

This unusual effect is very useful in a generator because it provides a unique signal which can immediately tell the observer which area of the generator is being overheated.

Because the effect is caused by a gas and not by a particle, a signal is more certain because gases do not deposit inside the generator as particles tend to, but rather are carried ultimately to the monitor. This lack of deposition for gases also results in a much longer signal than particles produce, so that a signal is less likely to be regarded as a temporary aberation.

DESCRIPTION OF THE INVENTION

Figure 2:
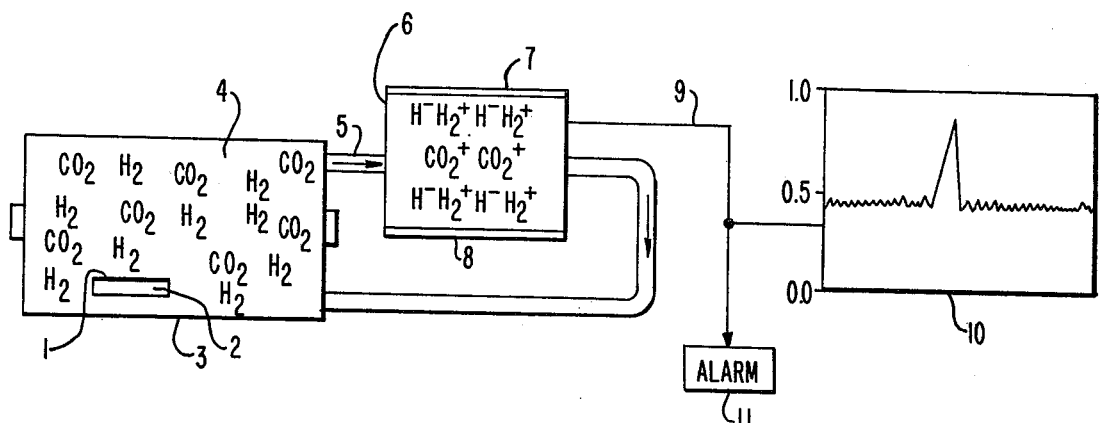
FIG. 2 is a diagram illustrating the method of this invention.
Figure 1:
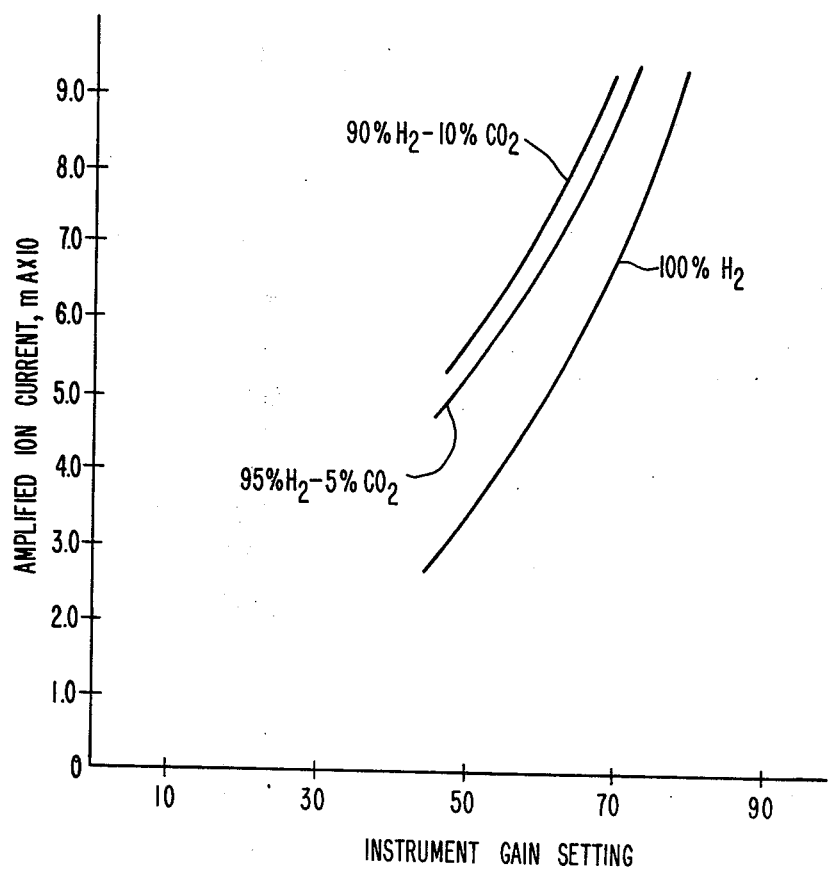
FIG. 1 is a graph showing the relationship between the ratio of hydrogen to carbon dioxide in a test gas to the current in an ion chamber monitor.

In FIG. 2, a coating 1 on a portion 2 of generator 3 becomes hot and releases carbon dioxide into the cooling hydrogen stream 4 of generator 3. A portion 5 of hydrogen stream 4 is diverted into monitor 6 then back to generator 3. The monitor contains electrodes 7 and 8 which ionize the hydrogen gas into $H^-$ and $H_2^+$ ions causing a current to flow between electrodes 7 and 8. The current is sent via line 9 to recorder 10 and alarm 11. When carbon dioxide appears between electrodes 7 and 8 it is ionized to $CO_2^+$ and increases the current flowing between the electrodes and to recorder 10 and alarm 11. The increased current is recorded by recorder 10 and sets off alarm 11.

In an ion chamber monitor a radiation source disassociates hydrogen from the generator gas stream into $H^+$ and $H^-$ ions which are collected, producing an electric current. In the absence of particles, almost all the ions are collected, resulting in a maximum output current of a magnitude determined by the strength of the radiation source, the ionization properties of the gas stream, and the flow rate. When particles are present in the gas stream, a combination between ion and particle occurs. Because the particles are much larger than the ions, the mobility of the resultant charged particle is less, and fewer are collected in the ion chamber. The result is a decrease in the output current of the ion chamber. The mode of action of all sacrificial coatings developed to date has been to decrease the output current of the instrument.

In certain instances, however, the output ion current of the monitor can be increased. The normal ion current, $I_o$, with no particles present is given by the equation:

$$I_o = Qe\sqrt{q/a}$$

where Q = flow rate
e = electronic charge q = rate of formation of ions, ion pairs/ml/sec and
a = self-recombination rate of ions.

From the above equation, it can be seen that if a (the self-recombination rate) decreases, the ion current will increase. In the case of hydrogen alone, a is the recombination rate for $H_2^+$ with $H^-$. Generally speaking, the recombination of $H^-$ with any other species (e.g., $CO_2^+$) would be slower. Hence, in the latter instance, if $CO_2$ were present in the hydrogen stream, a would be smaller and $I_o$ (the ion current) larger. However, not only must this species be liberated into the hydrogen stream, but it must be liberated in sufficient quantities to affect the overall self-combination value (as the normal $H_2^+/H^-$ recombination will also be present due to the stream of hydrogen).

A verification of this hypothesis was achieved experimentally by determining the effect of hydrogen and carbon dioxide mixtures on the ion current of an ion chamber monitor. The gases were premixed prior to being passed through the instrument. A constant flow rate of 6 liters/minute was employed. The results are shown in the accompanying graph. In the first set of experiments, a reference line for hydrogen was developed using a 100% hydrogen gas flow. It can be seen from the other two lines in the graph that gas mixtures richer in carbon dioxide increase the ion current, i.e., 10% $CO_2$ has a greater effect than 5% $CO_2$.

The invention, of course, requires a monitor which is capable of detecting gases heavier than hydrogen. An ion chamber monitor, which operates by ionizing the hydrogen and measuring the resulting electric current, seems most suitable for the purpose of this invention. It is also necessary that a compound be placed in the generator at a location exposed to the gas stream which will thermally degrade to produce a gas detectable by the monitor.

In practicing the invention a composition is prepared of a positive signal producing compound (PSPC) in a solution of a resinous carrier. The PSPC may be dispersed if it is insoluble in the solvent (e.g., toluene) or it may be in solution if it is soluble in the solvent (e.g., ethyl alcohol or diethyl ether). Dispersions are preferred as they produce much more particulation than do solutions. A particle size of the dispersed PSPC of about 25 to about 1000 microns is suitable.

The composition may be prepared by simply mixing the ingredients, but it is preferable to mix the drier, resinous carrier, and solvent first and then add the PSPC to prevent the occlusion of the drier in the PSPC and thereby obtain a more homogeneous dispersion of the PSPC.

A suitable composition is a resinous carrier, about 20 to about 250 phr (parts by weight per hundred parts of resinous carrier) of the PSPC and about 25 to about 75% (by weight based on the resinous carrier) of a solvent for the resinous carrier. If the amount of PSPC is less than about 20 phr, the quantity of particles given off during decomposition may be too low to be detected by presently-existing detectors. However, the construction of more sensitive detectors would permit a lower amount of PSPC. If the amount of PSPC exceeds about 250 phr, the composition is thick, difficult to apply, and does not bond well. The preferred amount of PSPC, which generally gives the best results, is about 40 to about 60 phr. If the amount of solvent is less than about 25%, the composition is generally too viscous to apply easily and if the amount of solvent is greater than than about 75%, the composition is unnecessarily dilute and the coating may be too thin to produce an adequate number of particles during decomposition, at least while the malfunction is highly localized. Best results are usually obtained with about 45 to about 55% solvent.

The composition also preferably contains about 0.1 to about 3 phr of a drier when the resinous carrier is an epoxy resin or similar resin, to promote its room temperature cure. Lead naphthenate or cobalt naphthenate is preferred although stannous octoate, zinc stearate, etc., could also be used. Resins such as polyesters may also require the presence of an organic peroxide as is known in the art. Mixtures of various resins, solvents, or driers are also contemplated.

The resinous carrier performs the function of bonding the PSPC to the apparatus since a coating of PSPC by itself does not adhere well, although some PSPC may be found which can be used without a solvent or resin. The resinous carrier should be compatible with the other resins used in the apparatus and therefore it is usually advantageous to use the same resin used elsewhere. The resinous carrier is curable at 60° C. and is preferably air dryable since it cannot be easily cured in place with heat. Also, it should be stable after curing for several years at 60° C. The resin must be unreactive with the PSPC for otherwise suitable thermoparticulation will not occur. The PSPC and the resin form a mixture and the PSPC does not catalyze the cure of the resin. Epoxy resins are preferred as they are usually used elsewhere in the apparatus, but polyesters, silicone rubber, polystyrene, etc., could also be used.

The solvent for the resinous carrier depends on the particular resinous carrier used. Toluene, xyline, benzene, methyl ethyl ketone, ethyl alcohol, diethyl ether, acetone, cellosolve, etc., are common solvents that may be used. Toluene is preferred as it is inexpensive and dissolves most resins.

The composition is applied to portions of the electrical apparatus which are exposed to the gas stream. The coating does not function as insulation and is usually applied on top of insulation, but it can also be applied to conductors. The application may be made by brushing, spraying, dipping, grease gun, troweling, or other techniques. A suitable coating thickness (after drying) is about 1/16 to about ⅛ inch. The dispersed particles of PSPC should not be covered with excessive resinous carrier as that may prevent the decomposition gases and particles from escaping into the gas stream. After evapoaration of the solvent and room temperature cure of the resinous carrier, if necessary, the apparatus is ready to be operated. When thermoparticulation and the resulting positive signal occur, a sample of the gas stream can be collected and analyzed. Since PSPC's generally produce particles as well as the initial signal-producing gas, analysis of the sample can confirm the location of the overheating.

An effort was made to determine which gases are detectable by the monitor. Six compounds which had been found to increase the current in the ion chamber monitor were heated in an atmosphere of 20 torr $H_2$ in a glass tube attached to the inlet system of a mass spectrometer. The compounds were each heated to the lower limit of their increased ion current temperature range and an aliquot of gas was withdrawn for analysis. The temperature was then raised to the temperature of maximum signal and a second aliquot was withdrawn and analyzed. The gases present were identified from the mass spectra, and quantitative estimates were made for gases where calibration data were available. The results were summarized in the following table. The serial numbers refer to the hereinbefore cited patent applications.

| Compound | Temp. °C. | H$_2$ | Mole % CO$_2$ | Other* | |
|---|---|---|---|---|---|
| Zinc Acetylacetonate (Serial No. 568,221) | 88 | 58 | — | 42 | 2,4-pentanediene + H$_2$O |
|  | 133 | 49 | — | 5L | 2,4-pentanediene H$_2$O |
| Methenamine mandelate | 99 | 100 | TRACE | — |  |
|  | 123 | 87 | 12 | 1 | Benzaldehyde H$_2$O Unidentified |
| Toluene diisocyanate-diethylamine (Serial No. 568,222) | 136 | 91 | TRACE | 9 | Toluene Unidentified |
|  | 162 | 85 | 5 | 10 | Toluene Unidentified |
| Ethylmethyl ketoxime-phenylisocyanate (Serial No. 568,222) | 125 | 88 | 7 | 5 — | Benzene + CO? Benzene + |
|  | 166 | 51 | 31 | 18 | Unidentified |
| Selenium dimethyl-dithiocarbamate (Serial No 634,217) | 151 | 95 | — | 5 — | CS$_2$ |
|  | 188 | 64 | — | 36 — | CS$_2$ |
| Hexamethylene diisocyanate with thiophenol block (Serial No. 568,222) | 134 | 86 | 10 | 4 — | Unidentified |
|  | 162 | 82 | 15 | 3 — | Unidentified |
|  | 192 | 55 | 45 | — |  |

*Mole percentage determined by difference from 100%

From the above table it can be seen that all of the compounds do generate appreciable quantities of gases at the temperature range of increased ion current. For example, zinc acetylacetonate generates approximately 50 mole % of 2,4-pentanedione at approximately 130° C.

The self-recombination rate, a, would be lower in every instance when the recombining ions are H$^-$ with CO$_2$$^+$ (or CS$_2$ ion, or pentanedione ion, or benzene ion or tolene ion). Hence, it is likely that the increased ion current is due to the rapid evolution of these other gases into the hydrogen gas stream.

The gas that is produced should be free, rather than in an aerosol form, so that it can combine with the hydrogen ions. Also, of course, the gas must be ionizable, which excludes certain fluorinated gases. Of the gases found to be operable sulfur dioxide is preferred because it is a gas which is usually not present in a generator and therefore its presence is a clear indication of over-heating. At least 1 mole of gas should preferably be emitted per mole of compound for otherwise too much compound must be used.

An extensive search was made which resulted in identifying a number of compounds which produce an increased current in an ion chamber. The following example describes the preparation and testing of compositions containing these compounds.

EXAMPLE 1

The following composition was prepared using various PSPC:

| | Parts by Weight |
|---|---|
| PSPC | 100 |
| Epoxy resin, 50% solids in toluene, made from 200 pbw fatty acids, 200 pbw styrene, and 300 pbw diglycidyl ether of Bisphenol A, sold by Westinghouse Electric Corporation as "B-276" Varnish (See Example I of U.S. Pat. 2,909,497 for detailed description) | 100 |
| 6% solution in low boiling hydrocarbons of cobalt naphthenate | 1.0 |
| 24% solution in low boiling hydrocarbons of lead naphthenate | 0.25 |

The cobalt and lead naphthenate solutions were added to the epoxy resin prior to the addition of the PSPC.

Samples were prepared by brushing the above composition onto 3 inch by 1 inch aluminum sheets 1/16 to ¼ inches thick. The samples were dried overnight at 60° C. to form coatings ¼ inches thick, then placed in a forced-air oven at 60 or 80° C. for various periods to determine if they were stable and would function after aging.

The samples were placed one at a time in a stainless steel boat within a 1 inch o.d. stainless steel tube. Hydrogen was passed over the samples at flow rates of 6 l/min. A phase-controlled temperature regulator and programmer controlled the temperature in the boat and the temperature in the boat was measured by mounting a hot junction chromel-alumel thermocouple within a small hole in the boat. The output of the thermocouple and the detector were monitored on a two-pen potentiostatic recorder. A 6° C./min. heating rate was maintained in each experiment after the insertion of the sample in the boat.

The temperature at which the original amplified ion current increased from 0.8 mA (to 1.0 mA and above) and the temperature at which it later decreased were noted; these two temperatures enable an "increased ion current" range to be recorded for each sample. The following table gives the results. Serial numbers refer to the hereinbefore cited patent applications.

| Organic Compound used in Coating | Aging Conditions (forced air oven) | Increased Ion Current Region Temperature Range (° C.) | Duration of Signal (min) |
| --- | --- | --- | --- |
| Zinc acetylacetonate | 8 days at 60° C. | 88–93 | 5 |
| Zinc acetylacetonate | 29 days at 60° C. | 84–91 | 5 |
| Zinc acetylacetonate | 46 days at 60° C. | 95–102 | 5 |
| Methenamine mandelate | 44 days at 60° C. | 100–118 | 8 |
| Toluene diisocyanate-diethylamine | 20 days at 60° C. | 134–155 | 15 |
| Toluene diisocyanate-diethylamine | 8 days at 80° C. | 134–158 | 5 |
| Ethylmethyketoxime-phenylisocyanate | 1 day at 60° C. | 137–169 | 10 |
| Selenium dimethyldithiocarbamate | 8 days at 60° C. | 160–170 | 10 |
| Selenium dimethyldithiocarbamate | 15 days at 80° C. | 161–175 | 12 |
| Hexamethylene diisocyanate-thiophenol | 60 days at 60° C. | 143–150 & 160–195 | 5 25 |
| N-(cyclohexylthio)-phthalimide (Ser. No. 726,040) | 3-½ months at 60° C. | 160–177 | 12 |
| N-(cyclohexylthio)-phthalimde (Ser. No. 726,040) | 3-½ months at 80° C. | 167–182 | 10 |
| N-(phenylthio)-phthalimide (Ser. No. 726,040) | 3-κ months at 60° C. | 161–185 | 16 |
| N-(phenylthio)-phthalimide (Ser. No. 726,040) | 3-½ months at 80° C. | 150–175 | 20 |

The above table shows that some coatings are capable of initating increased ion current at temperatures as low as 84° C. (zinc acetylacetonate) and others as high as 161° C. (selenium dimethyldithiocarbomate). The entire temperature range covered by these coatings is 84°–195° C. It should be noted that the duration of the signal from hexamethylene diisocyanate-thiophenol was very long (approximately 30 minutes). All of these coatings produced low ion currents when heated to higher temperatures.

EXAMPLE 2

Two compositions were prepared and tested as in Example 1, after aging in nitrogen. The following table gives the results. In the table, the first temperature given in the organothermoparticulation range is the temperature at which a negative signal (due to particles) was received and the second temperature is the temperature at which the current in the ion chamber monitor dropped to half its normal value.

| Compound | Aging Condition | Temperature of Positive Signal (° C.) | Organothermoparticulation Range (° C.) |
| --- | --- | --- | --- |
| Morpholine p-toluene Sulfonate | 120 days at 80° C. | 169 | 172–176 |
| | 9 ½ months at 80° C. | 168 | 174–179 |
| | 1 ½ years at 100° C. | 166 | 172–182 |
| n-propylamine p-toluene sulfonate | 2 months at 80° C. | 170 | 173–175 |
| | 1 year at 100° C. | 169 | 173–180 |

The above table shows that the positive signal occurs at a lower temperature than the negative signal and therefore provides an earlier warning.

EXAMPLE 3

Compositions were prepared and tested as in Example 1. The following table lists the various compounds tested and the temperature at which a positive signal occurred. Serial numbers refered to the hereinbefore-cited patent applications.

| Compound | Positive Signal Temperature (° C) |
| --- | --- |
| Morpholine-2-naphthalene (S.N. 645,164) | 143 |
| n-butylamine benzene sulfonate (S.N. 645,164) | 184 |
| 2-(morpholino-thio)benzothiazole (S.N. 699,561) | 147 |
| n-tertia-butyl-2-benzothiazole sulfenamide (S.N. 699,561) | 110 |
| tetramethylthiuram monsulfide (S.N. 726,039) | 140 |
| 1,1,3,3-tetramethyl-2-thiourea (S.N. 726,039) | 130 |
| Hydroxyurea (S.N. 726,039) | 143 |
| Toluene diisocyanate/dimethylamine block isocyanate (S.N. 568,222) | 124 |
| β-napthol/acrylonitrile cyano-ethylated product (S.N. 702,257) | 136 |
| Benzyldimethylamino-p-toluene sulfonate (S.N. 645,164) | 173 |
| n-propylamine-p-toluene sulfonate (S.N. 645,164) | 165 |
| t-butylamine-p-toluene sulfonate (S.N. 645,164) | 174 |
| Manganese (II) acetylacetonate (S.N. 568,221) | 153 |
| N-oxydiethylene 2 benzothiazole sulfinamide (S.N. 699,561) | 127 |
| Hexamethylene diisocyanate/thiophenol blocked isocyanate (S.N. 568,222) | 143 |
| Phenyl isocyanate/butyglycidyl ether blocked isocyanate (S.N. 568,222) | 137 |
| Hexamethylene diisocyanate/dimethylamine blocked isocyanate (S.N. 568,222) | 134 |
| Formamidine sulfinic acid | 170 |
| Cadmium diethyldithiocarbamate (S.N. 634,217) | 187 |
| Selenium diethyldithiocarbamate (S.N. 634,217) | 156, 172 |
| Morpholine-p-toluene sulfonate (S.N. 645,164) | 168 |

-continued

| Compound | Positive Signal Temperature (° C.) |
|---|---|
| p-diethylamino benzene diazonium fluoroborate | 147 |
| t-butylurea (S.N. 726,039) | 85 |
| Tellurium diethyldithiocarbamate (S.N. 634,217) | 177 |

We claim:

1. A method of detecting overheating in electrical apparatus cooled by a hydrogen stream, comprising
   (1) applying a coating to a position in said electrical apparatus which is exposed to said hydrogen stream, said coating containing a compond which decomposes between 80° and 200° C. to produce a gas heavier than hydrogen;
   (2) ionizing at least a portion of said hydrogen stream and measuring the flow of electrical current across said ionized hydrogen stream;
   (3) monitoring said electrical current for an increase in said electric current; and
   (4) using said increase in said electric current as an indication that overheating has occurred in said electrical appparatus.

2. A method according to claim 1 wherein said compound is methenamine mandelate.

3. A method according to claim 1 wherein said compound produces at least one mole of gas per mole of compound.

4. A method according to claim 1 wherein said gas has a molecular weight of at least 30.

5. A method according to claim 4 wherein said gas is sulfur dioxide.

6. A method according to claim 1 wherein said hydrogen gas is ionized with alpha radiation.

7. The method according to claim 1 wherein said compound is formamidine sulfinic acid.

8. The method according to claim 1 wherein said electrical apparatus is a generator.

* * * * *